United States Patent
Hsia

(10) Patent No.: US 10,123,388 B2
(45) Date of Patent: Nov. 6, 2018

(54) SOLID-STATE LIGHTING WITH MULTIPLE DRIVERS

(71) Applicant: Aleddra Inc., Renton, WA (US)

(72) Inventor: Chungho Hsia, Bellevue, WA (US)

(73) Assignee: ALEDDRA INC., Renton, WA (US)

( * ) Notice: Subject to any disclaimer, the term of this patent is extended or adjusted under 35 U.S.C. 154(b) by 0 days.

(21) Appl. No.: 15/947,631

(22) Filed: Apr. 6, 2018

(65) Prior Publication Data

US 2018/0228001 A1    Aug. 9, 2018

Related U.S. Application Data

(63) Continuation-in-part of application No. 15/911,086, filed on Mar. 3, 2018, which is a continuation-in-part of application No. 15/897,106, filed on Feb. 14, 2018, which is a continuation-in-part of application No. 15/874,752, filed on Jan. 18, 2018, now Pat. No. 10,036,515, which is a continuation-in-part of application No. 15/836,170, filed on Dec. 8, 2017, now Pat. No. 10,021,753, which is a continuation-in-part of application No. 15/649,392, filed on Jul. 13, 2017, now Pat. No. 9,986,619, which is a continuation-in-part of application No. 15/444,536, filed on Feb. 28, 2017, now Pat. No. 9,826,595, which is a continuation-in-part of application No. 15/362,772, filed on Nov. 28, 2016, now Pat. No. 9,967,927, which is a continuation-in-part of application No. 15/225,748, (Continued)

(51) Int. Cl.
  *H05B 33/08* (2006.01)
  *H02J 7/00* (2006.01)
  *G01R 31/36* (2006.01)

(52) U.S. Cl.
  CPC ..... *H05B 33/0884* (2013.01); *G01R 31/3627* (2013.01); *H02J 7/0068* (2013.01)

(58) Field of Classification Search
  None
  See application file for complete search history.

(56) References Cited

U.S. PATENT DOCUMENTS 9,047,076 B1* 6/2015 Lee ............... G06F 1/263
9,667,096 B2* 5/2017 Han ............... F21S 9/022
(Continued)

*Primary Examiner* — Minh D A
*Assistant Examiner* — James H Cho
(74) *Attorney, Agent, or Firm* — Han IP PLLC; Andy M. Han

(57) ABSTRACT

An LED luminaire comprises a rechargeable battery, LED array(s), multiple drivers, and a control circuit. The LED luminaire may be used to replace a fluorescent or a conventional LED lamp connected to AC mains. The multiple drivers comprise a first driver configured to charge the rechargeable battery, a second driver configured to convert a DC voltage from the rechargeable battery to light up the LED array(s) when a line voltage from the AC mains is unavailable, and a third driver configured to operate the LED array(s) when the line voltage from the AC mains is available. The control circuit is configured to manage the multiple drivers in a way that the second driver is disabled when the line voltage from the AC mains is available and that the first driver and the third driver are disabled when a rechargeable battery test is performed, without ambiguity and safety issues.

15 Claims, 5 Drawing Sheets

Related U.S. Application Data filed on Aug. 1, 2016, now Pat. No. 9,743,484, which is a continuation-in-part of application No. 14/818,041, filed on Aug. 4, 2015, now Pat. No. 9,420,663, which is a continuation-in-part of application No. 14/688,841, filed on Apr. 16, 2015, now Pat. No. 9,288,867, which is a continuation-in-part of application No. 14/465,174, filed on Aug. 21, 2014, now Pat. No. 9,277,603, which is a continuation-in-part of application No. 14/135,116, filed on Dec. 19, 2013, now Pat. No. 9,163,818, which is a continuation-in-part of application No. 13/525,249, filed on Jun. 15, 2012, now Pat. No. 8,749,167.

(56) References Cited

U.S. PATENT DOCUMENTS

| | | | |
|---|---|---|---|
| 9,948,118 B1 * | 4/2018 | Patton | H02J 7/0021 |
| 2013/0127362 A1 * | 5/2013 | Trainor | H02J 9/065 |
| | | | 315/224 |

\* cited by examiner

SOLID-STATE LIGHTING WITH MULTIPLE DRIVERS

CROSS-REFERENCE TO RELATED APPLICATIONS

The present disclosure is part of a continuation-in-part (CIP) application of U.S. patent application Ser. No. 15/911,086, filed 3 Mar. 2018, which is part of a CIP application of U.S. patent application Ser. No. 15/897,106, filed 14 Feb. 2018, which is a CIP application of U.S. patent application Ser. No. 15/874,752, filed 18 Jan. 2018, which is a CIP application of U.S. patent application Ser. No. 15/836,170, filed 8 Dec. 2017, which is a CIP application of U.S. patent application of Ser. No. 15/649,392 filed 13 Jul. 2017, which is a CIP application of U.S. patent application Ser. No. 15/444,536, filed 28 Feb. 2017 and issued as U.S. Pat. No. 9,826,595 on 21 Nov. 2017, which is a CIP application of U.S. patent application Ser. No. 15/362,772, filed 28 Nov. 2016, which is a CIP application of U.S. patent application Ser. No. 15/225,748, filed 1 Aug. 2016 and issued as U.S. Pat. No. 9,743,484 on 22 Aug. 2017, which is a CIP application of U.S. patent application Ser. No. 14/818,041, filed 4 Aug. 2015 and issued as U.S. Pat. No. 9,420,663 on 16 Aug. 2016, which is a CIP application of U.S. patent application Ser. No. 14/688,841, filed 16 Apr. 2015 and issued as U.S. Pat. No. 9,288,867 on 15 Mar. 2016, which is a CIP application of U.S. patent application Ser. No. 14/465,174, filed 21 Aug. 2014 and issued as U.S. Pat. No. 9,277,603 on 1 Mar. 2016, which is a CIP application of U.S. patent application Ser. No. 14/135,116, filed 19 Dec. 2013 and issued as U.S. Pat. No. 9,163,818 on 20 Oct. 2015, which is a CIP application of U.S. patent application Ser. No. 13/525,249, filed 15 Jun. 2012 and issued as U.S. Pat. No. 8,749,167 on 10 Jun. 2014. Contents of the above-identified applications are incorporated herein by reference in their entirety.

BACKGROUND

Technical Field

The present disclosure relates to light-emitting diode (LED) luminaires and more particularly to an LED luminaire with multiple drivers auto-selected for operations with a line voltage from alternate-current (AC) mains or a direct-current (DC) voltage from a rechargeable battery without ambiguity.

Description of the Related Art

Solid-state lighting from semiconductor LEDs has received much attention in general lighting applications today. Because of its potential for more energy savings, better environmental protection (with no hazardous materials used), higher efficiency, smaller size, and longer lifetime than conventional incandescent bulbs and fluorescent tubes, the LED-based solid-state lighting will be a mainstream for general lighting in the near future. Meanwhile, as LED technologies develop with the drive for energy efficiency and clean technologies worldwide, more families and organizations will adopt LED lighting for their illumination applications. In this trend, the potential safety concerns such as risk of electric shock and fire become especially important and need to be well addressed.

In today's retrofit applications of an LED lamp to replace an existing fluorescent lamp, consumers may choose either to adopt a ballast-compatible LED lamp with an existing ballast used to operate the fluorescent lamp or to employ an AC mains-operable LED lamp by removing/bypassing the ballast. Either application has its advantages and disadvantages. In the former case, although the ballast consumes extra power, it is straightforward to replace the fluorescent lamp without rewiring, which consumers have a first impression that it is the best alternative. But the fact is that total cost of ownership for this approach is high regardless of very low initial cost. For example, the ballast-compatible LED lamps work only with particular types of ballasts. If the existing ballast is not compatible with the ballast-compatible LED lamp, the consumer will have to replace the ballast. Some facilities built long time ago incorporate different types of fixtures, which requires extensive labor for both identifying ballasts and replacing incompatible ones. Moreover, the ballast-compatible LED lamp can operate longer than the ballast. When an old ballast fails, a new ballast will be needed to replace in order to keep the ballast-compatible LED lamps working. Maintenance will be complicated, sometimes for the lamps and sometimes for the ballasts. The incurred cost will preponderate over the initial cost savings by changeover to the ballast-compatible LED lamps for hundreds of fixtures throughout a facility. In addition, replacing a failed ballast requires a certified electrician. The labor costs and long-term maintenance costs will be unacceptable to end users. From energy saving point of view, a ballast constantly draws power, even when the ballast-compatible LED lamps are dead or not installed. In this sense, any energy saved while using the ballast-compatible LED lamps becomes meaningless with the constant energy use by the ballast. In the long run, the ballast-compatible LED lamps are more expensive and less efficient than self-sustaining AC mains-operable LED lamps.

On the contrary, an AC mains-operable LED lamp does not require a ballast to operate. Before use of the AC mains-operable LED lamp, the ballast in a fixture must be removed or bypassed. Removing or bypassing the ballast does not require an electrician and can be replaced by end users. Each AC mains-operable LED lamp is self-sustaining. Once installed, the AC mains-operable LED lamps will only need to be replaced after 50,000 hours. In view of above advantages and disadvantages of both the ballast-compatible LED lamps and the AC mains-operable LED lamps, it seems that market needs a most cost-effective solution by using a universal LED lamp that can be used with the AC mains and is compatible with a ballast so that LED lamp users can save an initial cost by changeover to such an LED lamp followed by retrofitting the lamp fixture to be used with the AC mains when the ballast dies.

Furthermore, the AC mains-operable LED lamps can easily be used with emergency lighting, which is especially important in this consumerism era. The emergency lighting systems in retail sales and assembly areas with an occupancy load of 100 or more are required by codes in many cities. Occupational Safety and Health Administration (OSHA) requires that a building's exit paths be properly and automatically lighted at least ninety minutes of illumination at a minimum of 10.8 lux so that an employee with normal vision can see along the exit route after the building power becomes unavailable. This means that emergency egress lighting must operate reliably and effectively during low visibility evacuations. To ensure reliability and effectiveness of backup lighting, building owners should abide by the National Fire Protection Association's (NFPA) emergency egress light requirements that emphasize performance, operation, power source, and testing. OSHA requires most commercial buildings to adhere to the NFPA standards or a significant fine. Meeting OSHA requirements takes time and investment, but not meeting them could result in fines and even prosecution. If a building has egress lighting problems that constitute code violations, the quickest way to fix is to replace existing lamps with multi-function LED lamps that have an emergency light package integrated with the normal lighting. The code also requires the emergency lights be inspected and tested to ensure they are in proper working conditions at all times. It is, therefore, the manufacturers' responsibility to design an LED lamp or an LED luminaire with an emergency LED module integrated such that after the LED lamp or the LED luminaire is installed on a ceiling or in a room, the emergency LED module can be individually inspected on site.

SUMMARY

A light-emitting diode (LED) luminaire comprising a full-wave rectifier, multiple drivers, one or more LED arrays, a rechargeable battery, and a control circuit, is used to replace a fluorescent or a conventional LED luminaire in luminaire fixture sockets connected to the AC mains. The LED luminaire with the multiple drivers auto-selects a line voltage from the AC mains or a DC voltage from a rechargeable battery. The LED luminaire further comprises an input filter configured to suppress electromagnetic interference (EMI) noise. The full-wave rectifier is configured to convert an input AC voltage from the AC mains into a first direct current (DC) voltage. The multiple drivers comprise a first driver, a second driver, and a third driver. The first driver comprises a first power sustaining device, a first ground reference, and a second ground reference electrically isolated from the first ground reference. The first driver is coupled to the full-wave rectifier via the input filter, configured to convert the first DC voltage into a second DC voltage for charging the rechargeable battery to reach a third DC voltage. The second driver comprises a second power sustaining device, receiving the third DC voltage from the rechargeable battery and converting the third DC voltage into a fourth DC voltage to light up the one or more LED arrays when the line voltage from the AC mains is unavailable. The third driver comprises a third power sustaining device, coupled to the full-wave rectifier via the input filter. The third driver is configured to convert the first DC voltage into a fifth DC voltage for powering up the one or more LED arrays when the line voltage from the AC mains is available. The control circuit comprises an optocoupler, configured to disable the second driver by controlling the second power sustaining device when the line voltage from the AC mains is available and to disable the first driver and the third driver by respectively controlling the optocoupler and the third power sustaining device when a rechargeable battery test is performed, The optocoupler comprises an infrared emitting diode and a phototransistor, respectively coupled to the second ground reference and the first ground reference. The optocoupler is configured to disable the first driver when disabled. The first driver, the second driver, the third driver, and the control circuit are configured to auto-select the line voltage from the AC mains or the third DC voltage from the rechargeable battery to operate the one or more LED arrays without ambiguity. The rechargeable battery test is performed to ensure that the rechargeable battery is in a working condition at all times.

The first driver is coupled to the second driver via a first diode to control a current flowing direction. The second driver is coupled to the one or more LED arrays via a second diode and a first inductor. When the one or more LED arrays receive a driving current from the second driver, a current returned from the one or more LED arrays flows via a second inductor and a third diode to the second ground reference, completing a power transfer from the rechargeable battery. The third driver is coupled to the one or more LED arrays directly. When the one or more LED arrays receive a driving current from the third driver, a current returned from the one or more LED arrays flows back to the third driver connected to the first ground reference, completing a power transfer from the AC mains.

The control circuit further comprises a first transistor connected to the infrared LED of the optocoupler, whereas when the line voltage from the AC mains is available, the first transistor is on, and so is the infrared LED, thus turning on the phototransistor of the optocoupler and subsequently activating the first power sustaining device by accessing an electric current return path via the first ground reference, thereby enabling the first driver. The control circuit further comprises a second transistor coupled to the second driver, configured to pull down a voltage on the second power sustaining device, thereby disabling the second driver when the line voltage from the AC mains is available. The control circuit further comprises a third transistor coupled to the third driver, configured to pull down a voltage on the third power sustaining device, thereby disabling the third driver when a rechargeable battery test is performed. The control circuit further comprises a test switch, whereas when the rechargeable battery test is performed, the test switch is enabled to send a low-level test signal relative to the second ground reference. The test switch is further coupled to the second transistor to recover a voltage on the second power sustaining device, thereby enabling the second driver when the rechargeable battery test is performed. The test switch is further coupled to the first transistor, configured to disable the optocoupler, thereby disconnecting the first power sustaining device from the first ground reference and thus disabling the first driver when the rechargeable battery test is performed. The control circuit further comprises a voltage sensor configured to monitor the line voltage from the AC mains, whereas when the rechargeable battery test is performed, the voltage sensor senses a voltage glitch in the line voltage from the AC mains and controls the third transistor to disable the third driver.

In these ways, the control circuit is enabled to manage the multiple drivers such that the second driver is disabled when the line voltage from the AC mains is available and that the first driver and the third driver are disabled when a rechargeable battery test is performed, whereas the one or more LED arrays are operated by the multiple drivers controlled by the control circuit without ambiguity and safety issues.

In one embodiment, the multiple drivers, the rechargeable battery, and the control circuit are integrated with the one or more LED arrays in the LED luminaire to operate the one or more LED arrays. In another embodiment, the multiple drivers and the control circuit are integrated in an electronic control module to externally operate the one or more LED arrays in an LED lamp.

BRIEF DESCRIPTION OF THE DRAWINGS

Non-limiting and non-exhaustive embodiments of the present disclosure are described with reference to the following figures, wherein like reference numerals refer to like parts throughout the various figures unless otherwise specified.

DETAILED DESCRIPTION OF THE INVENTION

Figure 1:
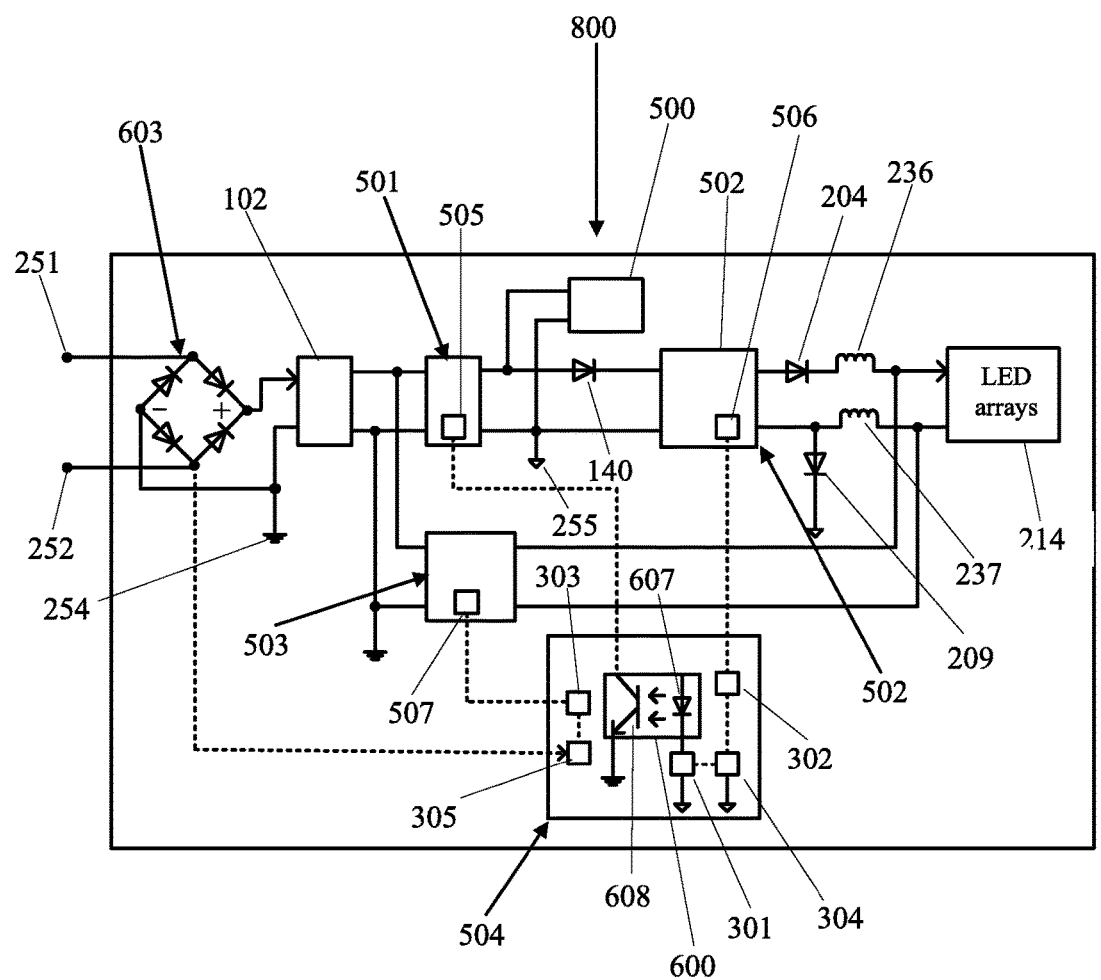
FIG. 1 is a block diagram of an LED luminaire with multiple drivers auto-selected for operations with a line voltage from the AC mains or a DC voltage from a rechargeable battery according to the present disclosure.

FIG. 1 is a block diagram of an LED luminaire 800 with multiple drivers auto-selected for operations with a line voltage from the AC mains or a DC voltage from a rechargeable battery according to the present disclosure. The LED luminaire 800 comprises one or more LED arrays 214; electrical conductors 251 and 252; a full-wave rectifier 603 connected to the two electrical conductors 251 and 252, a rechargeable battery 500, an input filter 102 configured to suppress EMI noise, a first driver 501, a second driver 502, a third driver 503, and a control circuit 504. The full-wave rectifier 603 is configured to convert an input AC voltage from the AC mains into a first DC voltage. The first driver 501 comprises a first power sustaining device 505, a first ground reference 254, and a second ground reference 255 electrically isolated from the first ground reference 254. The first driver 501 is coupled to the full-wave rectifier 603 via the input filter 102, configured to convert the first DC voltage into a second DC voltage for charging the rechargeable battery 500 to reach a third DC voltage. The second driver 502 comprises a second power sustaining device 506, receiving the third DC voltage from the rechargeable battery 500 and converting the third DC voltage from the rechargeable battery 500 into a fourth DC voltage to light up the one or more LED arrays 214 when the input AC voltage from the AC mains is unavailable. The third driver 503 comprises a third power sustaining device 507, coupled to the full-wave rectifier 603 via the input filter 102. The third driver 503 is configured to convert the first DC voltage into a fifth DC voltage for powering up the one or more LED arrays 214 when the input AC voltage from the AC mains is available. The control circuit 504 comprises an optocoupler 600, which is configured to disable the second driver 502 by controlling the second power sustaining device 506 when the input AC voltage from the AC mains is available and to disable the first driver 501 and the third driver 503 by respectively controlling the optocoupler 600 and the third power sustaining device 507 when a rechargeable battery test is performed. The optocoupler 600 comprises an infrared emitting diode 607 and a phototransistor 608, respectively coupled to the second ground reference 255 and the first ground reference 254. The optocoupler 600 is configured to disable the first driver 501 when disabled. The first driver 501, the second driver 502, the third driver 503, and the control circuit 504 are configured to auto-select the input AC voltage from the AC mains or the third DC voltage from the rechargeable battery 500 to operate the one or more LED arrays 214 without ambiguity. The rechargeable battery test is performed to ensure that the rechargeable battery 500 is in a working condition at all times. The full-wave rectifier 603 has a high electric potential V+ and a low electric potential V−, respectively connecting to the high side and the low side of the input filter 102 with the low electric potential connected to the first ground reference 254.

The first driver 501 is coupled to the second driver 502 via a first diode 140 to control a current flowing direction. The second driver 502 is coupled to the one or more LED arrays 214 via a second diode 204 and a first inductor 236. When the one or more LED arrays 214 receive a driving current from the second driver 502, a current returned from the one or more LED arrays 214 flows via a second inductor 237 and a third diode 209 to the second ground reference 255, completing a power transfer from the rechargeable battery 500. The third driver 503 is coupled to the one or more LED arrays 214 directly. When the one or more LED arrays 214 receive a driving current from the third driver 503, a current returned from the one or more LED arrays 214 flows back to the third driver 503 connected to the first ground reference 254, completing a power transfer from the AC mains.

In FIG. 1, the control circuit 504 further comprises a first transistor 301 connected to the infrared LED 607 of the optocoupler 600, whereas when the input AC voltage from the AC mains is available, the first transistor 301 is on, and so is the infrared LED 607, thus turning on the phototransistor 608 of the optocoupler 600 and subsequently activating the first power sustaining device 505 by accessing an electric current return path via the first ground reference 254, thereby enabling the first driver 501. The control circuit 504 further comprises a second transistor 302 coupled to the second driver 502, configured to pull down a voltage on the second power sustaining device 506, thereby disabling the second driver 502 when the line voltage from the AC mains is available. The control circuit 504 further comprises a third transistor 303 coupled to the third driver 503, configured to pull down a voltage on the third power sustaining device 507, thereby disabling the third driver 503 when a rechargeable battery test is performed. The control circuit 504 further comprises a test switch 304, whereas when the rechargeable battery test is performed, the test switch 304 is enabled to send a low-level test signal relative to the second ground reference 255. The test switch 304 is further coupled to the second transistor 302 to recover a voltage on the second power sustaining device 506, thereby enabling the second driver 502 when the rechargeable battery test is performed. The test switch 304 is further coupled to the first transistor 301, configured to disable the optocoupler 600, thereby disconnecting the first power sustaining device 505 from the first ground reference 254 and thus disabling the first driver 501 when the rechargeable battery test is performed. The control circuit 504 further comprises a voltage sensor 305 coupled to the electrical conductor 252. The voltage sensor 305 is configured to monitor the line voltage from the AC mains, whereas when the rechargeable battery test is performed, the voltage sensor 305 senses a voltage glitch in the line voltage from the AC mains and controls the third transistor 303 to disable the third driver 503.

Figure 2:
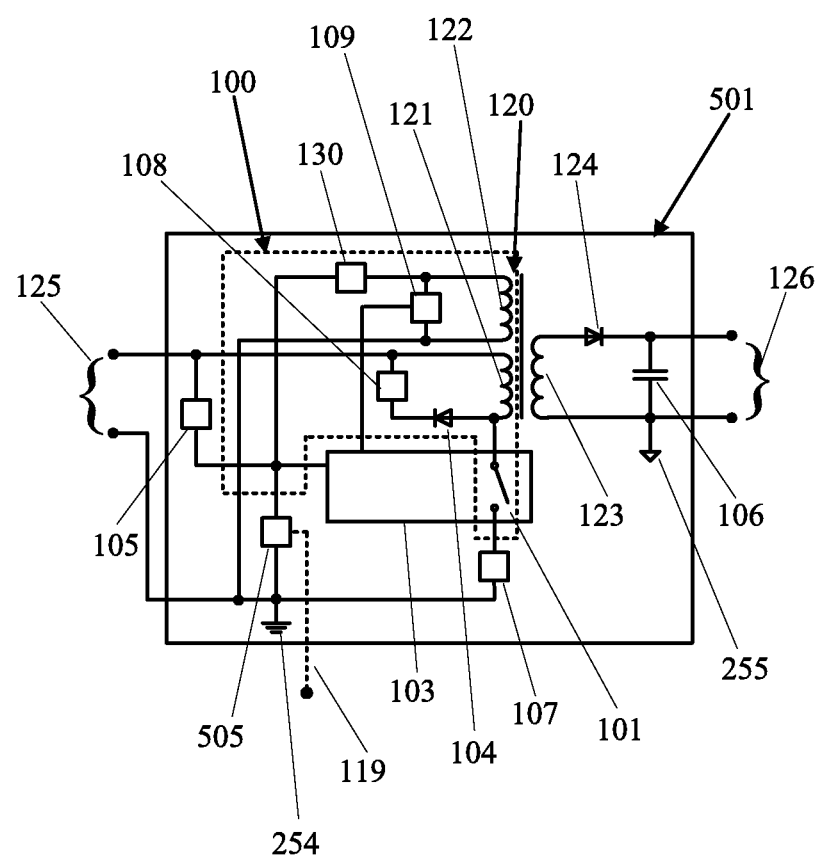
FIG. 2 is an embodiment of a first driver according to the present disclosure.

FIG. 2 is an embodiment of the first driver according to the present disclosure. The first driver 501 further comprises a first transformer 120 configured to isolate a first output 126 from a first input 125, whereas the first input 125 and the first output 126 are respectively coupled to the first ground reference 254 and the second ground reference 255. The first driver 501 is an isolated step-down converter with the second DC voltage lower than the first DC voltage but higher than the third voltage for charging the rechargeable battery 500. The first driver 501 further comprises one or more start-up resistors 105, a power factor correction (PFC) and control device 103, a Buck converter 100 in communicating with the PFC and control device 103, an output capacitor 106 connected to a secondary winding 123 of the first transformer 120 to build up an output voltage and to charge the rechargeable battery 500 (in FIG. 1), a current sensing resistor 107, and a diode 124 to control an output current to flow into the rechargeable battery 500. The Buck converter 100 comprises a switch 101 controlled by the PFC and control device 103, a diode 104, a Zener diode 108, an inductor 121 (i.e., a primary winding of the first transformer 120) with its current charging and discharging controlled by the switch 101 and the diode 104, a voltage divider 109, and a voltage feedback module 130 extracting partial energy from an assistance winding 122 of the first transformer 120 to pump energy in the first power sustaining device 505 and to sustain the PFC and control device 103. The first power sustaining device 505 is configured to provide a low DC voltage operating the PFC and control device 103. When the low DC voltage provided by the first power sustaining device 505 is depleted, the PFC and control device 103 stops to work, so as the first driver 501. When the low DC voltage from the first power sustaining device 505 applies to the PFC and control device 103, the first driver 501 sustains its operation, in which the first driver 501 can detect zero current in the inductor 121 within an AC cycle of an input voltage generating a zero current detection signal and controls the switch 101 on and off with a constant on-time and a varied off-time controlled by the zero current detection signal. By adapting switching frequencies, switching on-time and switching off-time, the PFC and control device 103 controls the switch 101 on and off in a way that the inductor 121 is charged during the switching on-time and discharged during the switching off-time, and that a desired output voltage is reached to charge the rechargeable battery 500. The average inductor current is thus equal to the output current that flows into the rechargeable battery 500. When the switch 101 is on, and the diode 104 is reverse-biased, an input current flows from the switch 101 and the current sensing resistor 107 into the inductor 121. When the current flowing into the inductor 121 increases, the voltage across the current sensing resistor 107 increases. The current sensing resistor 107 connects with the PFC and control device 103, which continuously receives signals and adjusts the switching off-time such that the output voltage and current to the rechargeable battery 500 are regulated to meet the battery charging requirements. The output capacitor 106 receives energy to build up an output voltage and to conduct a current via the diode 124 to charge the rechargeable battery 500. In FIG. 2, the first power sustaining device 505 is connected to the phototransistor 608 of the optocoupler 600 via a linking line 119 and controlled by the optocoupler 600, as depicted in FIG. 1.

Figure 3:
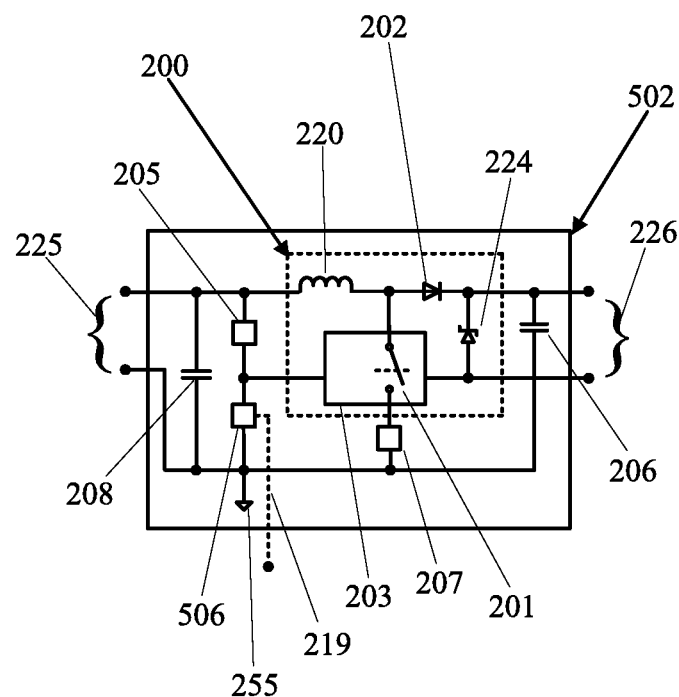
FIG. 3 is an embodiment of a second driver according to the present disclosure.

FIG. 3 is an embodiment of the second driver according to the present disclosure. The second driver 502 is a non-isolated step-up converter with the fourth DC voltage higher than the third DC voltage from the rechargeable battery 500 and a forward voltage across the one or more LED arrays 214 to operate the one or more LED arrays 214 more efficiently when the line voltage from the AC mains is unavailable. The fourth DC voltage converted from the third DC voltage is so high to properly operate the one or more LED arrays without flickering. The second driver 502 converts the third DC voltage into the fourth DC voltage relative to the second ground reference 255, whereas a second input 225 and a second output 226 are respectively coupled to the rechargeable battery 500 via the first diode 140 and the one or more LED arrays 214 via the second diode 204, the first inductor 236, and the second inductor 237 depicted in FIG. 1. The second driver 502 further comprises an input capacitor 208, one or more start-up resistors 205, a PFC and control device 203, a Buck converter 200 in communicating with the PFC and control device 203, an output capacitor 206 connected to an inductor 220 via the second diode 204 to build up the fourth DC voltage and to operate the one or more LED arrays 214 (in FIG. 1), a current sensing resistor 207, and a diode 202 to control an output current to flow into the one or more LED arrays 214. The Buck converter 200 comprises a switch 201 controlled by the PFC and control device 203, the diode 202, a Zener diode 224, and the inductor 220 with its current charging and discharging controlled by the switch 201 and the diode 202. To sustain the PFC and control device 203, an electric current continuously pump energy in the second power sustaining device 506 via the one or more start-up resistors 205. The second power sustaining device 506 is configured to provide a low DC voltage operating the PFC and control device 203. When the low DC voltage provided by the second power sustaining device 506 is depleted, the PFC and control device 203 stops to work, so as the second driver 502. When the low DC voltage from the second power sustaining device 506 applies to the PFC and control device 203, the second driver 502 sustains its operation, in which the second driver 502 can detect zero current in the inductor 220 within an AC cycle of an input voltage generating a zero current detection signal and controls the switch 201 on and off with a constant on-time and a varied off-time controlled by the zero current detection signal. By adapting switching frequencies, switching on-time and switching off-time, the PFC and control device 203 controls the switch 201 on and off in a way that the inductor 220 is charged during the switching on-time and discharged during the switching off-time, and that a desired output voltage is reached to operate the one or more LED arrays 214. The average inductor current is thus equal to the output current that flows into the one or more LED arrays 214. When the switch 201 is on, and the diode 202 is reverse-biased, an input current flows from the switch 201 and the current sensing resistor 207 into the inductor 220. When the current flowing into the inductor 220 increases, the voltage across the current sensing resistor 207 increases. The current sensing resistor 207 connects with the PFC and control device 203, which continuously receives signals and adjusts the switching off-time such that the output voltage and current to the one or more LED arrays 214 are regulated to meet the operating requirements when the line voltage from the AC mains is unavailable or the rechargeable battery test is performed. When the switch 201 is off, the diode 202 is forward-biased, and the output voltage, the fourth DC voltage across the output capacitor 206 becomes the third DC voltage plus an inductor voltage charged when the switch 201 is on. Thus, the fourth DC voltage is higher than the third DC voltage. Such a voltage is built up at the second output 226, conducting a current flow via the second diode 204 (in FIG. 1) to operate the one or more LED arrays 214. In FIG. 3, the second power sustaining device 506 is connected to the second transistor 302 in the control circuit 600 via a linking line 219 and controlled by the test switch 304, as depicted in FIG. 1. In FIG. 3, the second driver 502 may further comprise the second diode 204, the third diode 209, the first inductor 236, and the second inductor 237 depicted in FIG. 1.

Figure 4:
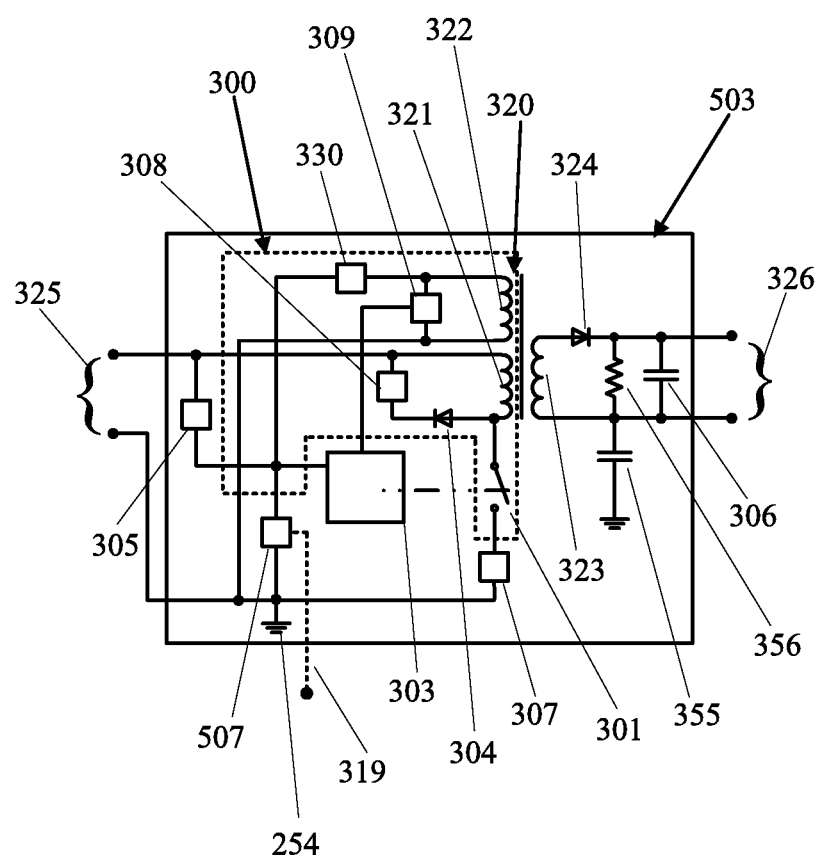
FIG. 4 is an embodiment of a third driver according to the present disclosure.

FIG. 4 is an embodiment of the third driver according to the present disclosure. The third driver 503 further comprises a second transformer 320 configured to isolate a third output 326 from a third input 325, whereas the third input 325 is coupled to the first ground reference 254, and the third output 326 is also coupled to the first ground reference 254 but via a line-bypass safety capacitor 355 to reduce a risk of electric shock. The third driver 503 is an isolated step-down converter with the fifth DC voltage lower than the first DC voltage but higher than the fourth voltage used to operate the one or more LED arrays 214 when the line voltage from the AC mains is unavailable or the rechargeable battery test is performed. The third driver 503 further comprises one or more start-up resistors 305, a PFC and control device 303, a Buck converter 300 in communicating with the PFC and control device 303, a resistor 356, an output capacitor 306 in parallel with the resistor 356 connected to a secondary winding 323 of the second transformer 320 to build up an output voltage, a current sensing resistor 307, and a diode 324 to control an output current to flow into the one or more LED arrays 214. The Buck converter 300 comprises a switch 301 controlled by the PFC and control device 303, a diode 304, a Zener diode 308, an inductor 321 (i.e., a primary winding of the second transformer 320) with its current charging and discharging controlled by the switch 301 and the diode 304, a voltage divider 309, and a voltage feedback module 330 extracting partial energy from an assistance winding 322 of the second transformer 320 to pump energy in the third power sustaining device 507 and to sustain the PFC and control device 303. The third power sustaining device 507 is configured to provide a low DC voltage operating the PFC and control device 303. When the low DC voltage provided by the third power sustaining device 507 is depleted, the PFC and control device 103 stops to work, so as the third driver 503. When the low DC voltage from the third power sustaining device 507 applies to the PFC and control device 303, the third driver 503 sustains its operation, in which the third driver 503 can detect zero current in the inductor 321 within an AC cycle of an input voltage generating a zero current detection signal and controls the switch 301 on and off with a constant on-time and a varied off-time controlled by the zero current detection signal. By adapting switching frequencies, switching on-time and switching off-time, the PFC and control device 303 controls the switch 301 on and off in a way that the inductor 321 is charged during the switching on-time and discharged during the switching off-time, and that a desired output voltage (i.e., the fifth DC voltage) is reached to operate the one or more LED arrays 214 at full power. The average inductor current is thus equal to the output current that flows into the one or more LED arrays 214. When the switch 301 is on, the diode 304 is reverse-biased, and an input current flows from the switch 301 and the current sensing resistor 307 into the inductor 321. When the current flowing into the inductor 321 increases, the voltage across the current sensing resistor 307 increases. The current sensing resistor 307 connects with the PFC and control device 303, which continuously receives signals and adjusts the switching off-time such that the output voltage and current to the one or more LED arrays 214 are regulated to meet the requirements at full power. The output capacitor 306 receives energy to build up an output voltage via the diode 324 and to operate the one or more LED arrays 214. In FIG. 4, the third power sustaining device 507 is connected to the third resistor 303 in the control circuit 504 via a linking line 319 and controlled by the voltage sensor 305, as depicted in FIG. 1.

In practice, the fourth DC voltage is designed to be lower than the fifth DC voltage to operate the one or more LED arrays 214 such that the one or more LED arrays 214 consume less power when the input AC voltage from the AC mains is unavailable than the one or more LED arrays do when the input AC voltage from the AC mains is available to save energy. In this case, the rechargeable battery 500 can last longer than 90 minutes, required by regulations. In FIG. 4, the fifth DC voltage is directly applied to the one or more LED arrays 214, whereas the fourth DC voltage converted by the second driver 506 received energy from the rechargeable battery 500 is applied to the one or more LED arrays 214 via the second diode 204, the first inductor 236, and the second inductor 237 to avoid any voltage crossovers.

Figure 5:
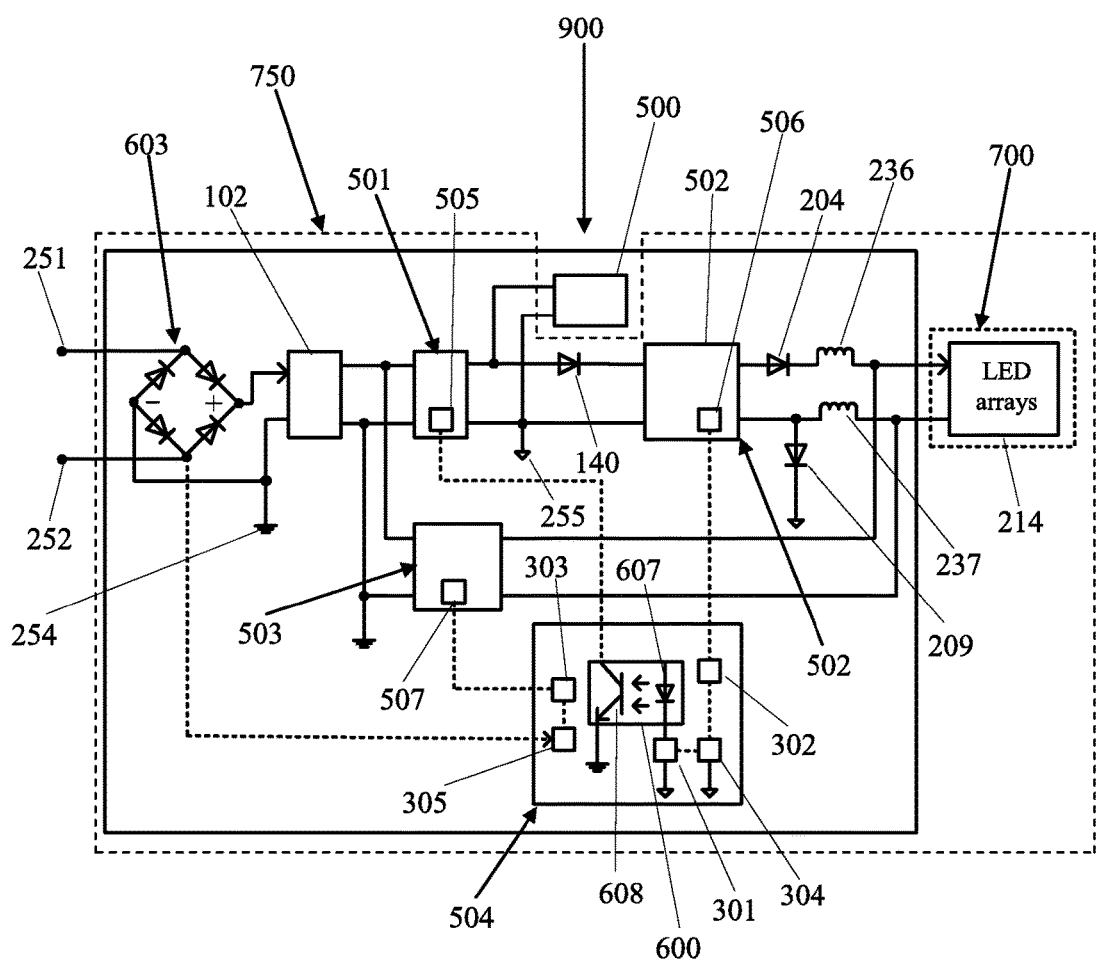
FIG. 5 is a block diagram of an LED luminaire with the multiple drivers and the control circuit integrated in an electronic control module to externally operate the one or more LED arrays in an LED lamp according to the present disclosure.

FIG. 5 is a block diagram of an LED luminaire 900 with the multiple drivers and the control circuit integrated in an electronic control module to externally operate the one or more LED arrays in an LED lamp according to the present disclosure. In FIG. 5, the same numerals are used for the same components as in FIG. 1. The LED luminaire 900 comprises a lamp 700 comprising one or more LED arrays 214, a rechargeable battery 500, and an electronic control module 750. The electronic control module 750 comprises electrical conductors 251 and 252, a full-wave rectifier 603 connected to the two electrical conductors 251 and 252, an input filter 102 configured to suppress EMI noise, a first driver 501, a second driver 502, a third driver 503, and a control circuit 504. The full-wave rectifier 603 is configured to convert an input AC voltage from the AC mains into a first direct current (DC) voltage. The first driver 501 comprises a first power sustaining device 505, a first ground reference 254, and a second ground reference 255 electrically isolated from the first ground reference 254. The first driver 501 is coupled to the full-wave rectifier 603 via the input filter 102, configured to convert the first DC voltage into a second DC voltage for charging the rechargeable battery 500 to reach a third DC voltage. The second driver 502 comprises a second power sustaining device 506, receiving the third DC voltage from the rechargeable battery 500 and converting the third DC voltage into a fourth DC voltage to light up the one or more LED arrays 214 when the input AC voltage from the AC mains is unavailable. The third driver comprises a third power sustaining device 507, coupled to the full-wave rectifier 603 via the input filter 102. The third driver 503 is configured to convert the first DC voltage into a fifth DC voltage for powering up the one or more LED arrays 214 when the input AC voltage from the AC mains is available. The control circuit 504 comprises an optocoupler 600. The control circuit 504 is configured to disable the second driver 502 by controlling the second power sustaining device 506 when the input AC voltage from the AC mains is available and to disable the first driver 501 and the third driver 503 by respectively controlling the optocoupler 600 and the third power sustaining device 507 when a rechargeable battery test is performed. The optocoupler 600 comprises an infrared emitting diode 607 and a phototransistor 608, respectively coupled to the second ground reference 255 and the first ground reference 254. The optocoupler 600 is configured to disable the first driver 501 when disabled. The first driver 501, the second driver 502, the third driver 503, and the control circuit 504 are configured to auto-select the input AC voltage from the AC mains or the third DC voltage from the rechargeable battery 500 to operate the one or more LED arrays 214 without ambiguity. The rechargeable battery test is performed to ensure that the rechargeable battery 500 is in a working condition all the time. The full-wave rectifier 603 has a high electric potential V+ and a low electric potential V−, respectively connecting to the high side and the low side of the input filter 102 with the low electric potential connected to the first ground reference 254.

The first driver 501 is coupled to the second driver 502 via a first diode 140 to control a current flowing direction. The second driver 502 is coupled to the one or more LED arrays 214 via a second diode 204 and a first inductor 236. When the one or more LED arrays 214 receive a driving current from the second driver 502, a current returned from the one or more LED arrays 214 flows via a second inductor 237 and a third diode 209 to the second ground reference 255, completing a power transfer from the rechargeable battery 500. The third driver 503 is coupled to the one or more LED arrays 214 directly. When the one or more LED arrays 214 receive a driving current from the third driver 503, a current returned from the one or more LED arrays 214 flows back to the third driver 503 connected to the first ground reference 254, completing a power transfer from the AC mains.

In FIG. 5, the control circuit 504 further comprises a first transistor 301 connected to the infrared LED 607 of the optocoupler 600, whereas when the input AC voltage from the AC mains is available, the first transistor 301 is on, and so is the infrared LED 607, thus turning on the phototransistor 608 of the optocoupler 600 and subsequently activating the first power sustaining device 505 by accessing an electric current return path via the first ground reference 254, thereby enabling the first driver 501. The control circuit 504 further comprises a second transistor 302 coupled to the second driver 502, configured to pull down a voltage on the second power sustaining device 506, thereby disabling the second driver 502 when the line voltage from the AC mains is available. The control circuit 504 further comprises a third transistor 303 coupled to the third driver 503, configured to pull down a voltage on the third power sustaining device 507, thereby disabling the third driver 503 when a rechargeable battery test is performed. The control circuit 504 further comprises a test switch 304, whereas when the rechargeable battery test is performed, the test switch 304 is enabled to send a low-level test signal relative to the second ground reference 255. The test switch 304 is further coupled to the second transistor 302 to recover a voltage on the second power sustaining device 506, thereby enabling the second driver 502 when the rechargeable battery test is performed. The test switch 304 is further coupled to the first transistor 301, configured to disable the optocoupler 600, thereby disconnecting the first power sustaining device 505 from the first ground reference 254 and thus disabling the first driver 501 when the rechargeable battery test is performed, The control circuit 504 further comprises a voltage sensor 305 connected to the electrical conductor 252, configured to monitor the line voltage from the AC mains, whereas when the rechargeable battery test is performed. The voltage sensor 305 senses a voltage glitch in the line voltage from the AC mains and controls the third transistor 303 to disable the third driver 503. The first driver 501, the second driver 502, and the third driver 503 in FIG. 5 has same configurations as depicted in FIGS. 2-4. The first driver 501, the second driver 502, and the third driver 503 are all switching power supplies, taking advantage of high efficiency and easily adapting to various input and output voltages. When used with the LED luminaire, such multiple drivers can improve luminaire efficacy when operating the LED luminaire and save energy when charging the rechargeable battery.

Whereas preferred embodiments of the present disclosure have been shown and described, it will be realized that alterations, modifications, and improvements may be made thereto without departing from the scope of the following claims. Another kind of schemes with multiple drivers adopted in an LED-based luminaire using various kinds of combinations to accomplish the same or different objectives could be easily adapted for use from the present disclosure. Accordingly, the foregoing descriptions and attached drawings are by way of example only, and are not intended to be limiting.

What is claimed is:

1. A light-emitting diode (LED) luminaire, comprising:
at least two electrical conductors configured to connect to alternate-current (AC) mains;
one or more LED arrays;
a rechargeable battery;
a full-wave rectifier connected to the at least two electrical conductors and configured to convert a line voltage from the AC mains into a first direct-current (DC) voltage;
an input filter configured to suppress electromagnetic interference (EMI) noise;
a first driver comprising a first power sustaining device, a first ground reference, and a second ground reference electrically isolated from the first ground reference and coupled to the full-wave rectifier via the input filter, the first driver configured to convert the first DC voltage into a second DC voltage that charges the rechargeable battery to reach a third DC voltage;
a second driver comprising a second power sustaining device, the second driver configured to receive the third DC voltage from the rechargeable battery and convert the third DC voltage into a fourth DC voltage to light up the one or more LED arrays when the line voltage from the AC mains is unavailable;
a third driver comprising a third power sustaining device and coupled to the full-wave rectifier via the input filter, the third driver configured to convert the first DC voltage into a fifth DC voltage that powers up the one or more LED arrays at full power and to meet LED luminaire efficacy requirements when the line voltage from the AC mains is available; and
a control circuit comprising an optocoupler, the control circuit configured to disable the second driver by controlling the second power sustaining device when the line voltage from the AC mains is available and to disable the third driver by controlling the third power sustaining device when a rechargeable battery test is performed,
wherein:
the optocoupler comprises an infrared LED and a phototransistor, respectively coupled to the second ground reference and the first ground reference, the optocoupler configured to disable the first driver when disabled;
the first driver, the second driver, the third driver, and the control circuit are configured to auto-select the line voltage from the AC mains or the third DC voltage from the rechargeable battery to operate the one or more LED arrays; and
the rechargeable battery test is performed to ensure that the rechargeable battery is in a working condition.

2. The LED luminaire of claim 1, wherein the control circuit further comprises a first transistor connected to the infrared LED of the optocoupler, and wherein when the line voltage from the AC mains is available, the first transistor is on, and so is the infrared LED, thus turning on the phototransistor of the optocoupler and subsequently activating the first power sustaining device by accessing an electric current return path via the first ground reference, thereby enabling the first driver.

3. The LED luminaire of claim 1, wherein the control circuit further comprises a second transistor coupled to the second driver, the second transistor configured to pull down a voltage on the second power sustaining device, thereby disabling the second driver when the line voltage from the AC mains is available.

4. The LED luminaire of claim 3, wherein the control circuit further comprises a test switch, and wherein when the rechargeable battery test is performed, the test switch is enabled to send a low-level test signal relative to the second ground reference.

5. The LED luminaire of claim 4, wherein the test switch is further coupled to the second transistor to recover a voltage on the second power sustaining device, thereby enabling the second driver when the rechargeable battery test is performed.

6. The LED luminaire of claim 4, wherein the test switch is further coupled to the first transistor, the test switch configured to disable the optocoupler, thereby disconnecting the first power sustaining device from the first ground reference and thus disabling the first driver when the rechargeable battery test is performed.

7. The LED luminaire of claim 1, wherein the control circuit further comprises a third transistor coupled to the third driver, the third transistor configured to pull down a voltage on the third power sustaining device, thereby disabling the third driver when the rechargeable battery test is performed.

8. The LED luminaire of claim 1, wherein the control circuit further comprises a voltage sensor configured to monitor the line voltage from the AC mains, and wherein when the rechargeable battery test is performed, the voltage sensor senses a voltage glitch in the line voltage from the AC mains and controls the third transistor to disable the third driver.

9. The LED luminaire of claim 1, wherein the first driver further comprises a first input, a first output, and a first transformer configured to isolate the first output from the first input, and wherein the first input and the first output are respectively coupled to the first ground reference and the second ground reference.

10. The LED luminaire of claim 1, wherein the third driver further comprises a third input, a third output, and a second transformer configured to isolate the third output from the third input, wherein the third input is coupled to the first ground reference, and wherein the second output is coupled to the first ground reference via a line-bypass safety capacitor to reduce a risk of electric shock.

11. The LED luminaire of claim 1, wherein the second driver further comprises a step-up converter with the fourth DC voltage higher than the third DC voltage and a forward voltage across the one or more LED arrays to operate the one or more LED arrays without flickering.

12. The LED luminaire of claim 1, wherein the fourth DC voltage is lower than the fifth DC voltage to operate the one or more LED arrays so that the one or more LED arrays consume less power when the line voltage from the AC mains is unavailable than the one or more LED arrays do when the input AC voltage from the AC mains is available.

13. The LED luminaire of claim 1, wherein the second driver further comprises at least one diode and at least one inductor connected to the one or more LED arrays, wherein the fifth DC voltage is directly applied to the one or more LED arrays, and wherein the fourth DC voltage is applied to the one or more LED arrays via the at least one diode and the at least one inductor to avoid voltage crossovers.

14. The LED luminaire of claim 1, wherein the first driver further comprises a first step-down converter with the second DC voltage lower than the first DC voltage but higher than the third DC voltage.

15. The LED luminaire of claim 1, wherein the third driver further comprises a second step-down converter with the fifth DC voltage lower than the first DC voltage but higher than the forward voltage across the one or more LED arrays, the second step-down converter configured to operate the one or more LED arrays at full power.

* * * * *